(12) United States Patent
Pizzuti et al.

(10) Patent No.: US 11,122,680 B2
(45) Date of Patent: Sep. 14, 2021

(54) PASSIVE METHODS OF LOOSE DIE IDENTIFICATION

(71) Applicant: International Business Machines Corporation, Armonk, NY (US)

(72) Inventors: Nicolas Pizzuti, Waterbury, VT (US); Tassbieh Hassan, Burke, VA (US); Nathaniel Rex, Burlington, VT (US); Kirk D. Peterson, Jericho, VT (US); Eric Marz, Williston, VT (US); Christine Whiteside, Charlotte, VT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 143 days.

(21) Appl. No.: 16/356,289

(22) Filed: Mar. 18, 2019

(65) Prior Publication Data

US 2020/0305274 A1    Sep. 24, 2020

(51) Int. Cl.
  *G06K 9/00* (2006.01)
  *H05K 1/02* (2006.01)
  *G01R 31/311* (2006.01)
  *G06T 7/00* (2017.01)
  *G06K 9/62* (2006.01)

(52) U.S. Cl.
  CPC ......... *H05K 1/0269* (2013.01); *G01R 31/311* (2013.01); *G06K 9/62* (2013.01); *G06T 7/001* (2013.01); *G06T 2207/30148* (2013.01)

(58) Field of Classification Search
  CPC .. G06K 9/62; G06T 7/001; G06T 2207/30148
  See application file for complete search history.

(56) References Cited

U.S. PATENT DOCUMENTS

| 4,825,093 | A | | 4/1989 | Kiriseko et al. | |
|---|---|---|---|---|---|
| 5,240,866 | A | * | 8/1993 | Friedman | H01L 22/20 702/35 |
| 5,544,256 | A | * | 8/1996 | Brecher | G06T 7/0006 382/149 |

(Continued)

FOREIGN PATENT DOCUMENTS

WO    2016081760 A1    5/2016

OTHER PUBLICATIONS

Classification of defects on semiconductor wafers using priority rules, N.G Shankar et al., Trans Tech Publications, 2004, pp. 135-148 (Year: 2004).*

(Continued)

*Primary Examiner* — Jayesh A Patel
(74) *Attorney, Agent, or Firm* — Cantor Colburn LLP; L. Jeffrey Kelly

(57) ABSTRACT

Embodiments of the invention are directed to a method and resulting structures for identifying an integrated circuit (IC) chip using optically-unique features. In a non-limiting embodiment of the invention, an imaging device generates an image of the chip. One or more optical features of the chip within the image can be determined and stored in a local or remote database. Metadata associated with the chip can be generated and linked with the one or more optical features of the chip and a unique identifier of the chip in the database.

11 Claims, 5 Drawing Sheets

(56) References Cited

U.S. PATENT DOCUMENTS

| | | | | |
|---|---|---|---|---|
| 5,841,893 | A * | 11/1998 | Ishikawa | G01N 21/88 |
| | | | | 382/145 |
| 5,991,699 | A * | 11/1999 | Kulkarni | H01L 22/20 |
| | | | | 257/E21.525 |
| 6,613,590 | B2 * | 9/2003 | Simmons | H01L 22/20 |
| | | | | 257/E21.525 |
| 6,826,298 | B1 | 11/2004 | O'Dell et al. | |
| 6,941,536 | B2 | 8/2005 | Muranaka | |
| 7,297,561 | B2 | 11/2007 | Tuttle et al. | |
| 7,877,722 | B2 | 1/2011 | Duffy et al. | |
| 8,472,696 | B2 * | 6/2013 | Konishi | H01L 22/12 |
| | | | | 382/149 |
| 8,903,125 | B2 * | 12/2014 | Ruth | G06K 9/00577 |
| | | | | 382/103 |
| 2003/0003608 | A1 * | 1/2003 | Arikado | H01L 23/544 |
| | | | | 438/14 |
| 2003/0058436 | A1 * | 3/2003 | Ono | G06T 7/62 |
| | | | | 356/237.2 |
| 2005/0040397 | A1 * | 2/2005 | Hui | H01L 23/544 |
| | | | | 257/48 |
| 2006/0274932 | A1 * | 12/2006 | Ikeda | G06F 3/0486 |
| | | | | 382/145 |
| 2007/0255513 | A1 * | 11/2007 | Takahashi | G01N 21/9501 |
| | | | | 702/35 |
| 2008/0007284 | A1 * | 1/2008 | Balog | G01R 31/31707 |
| | | | | 324/750.15 |
| 2008/0081385 | A1 * | 4/2008 | Marella | G06T 7/0008 |
| | | | | 438/14 |
| 2009/0074286 | A1 * | 3/2009 | Kitazawa | G01N 21/9501 |
| | | | | 382/144 |
| 2009/0297019 | A1 * | 12/2009 | Zafar | G03F 1/84 |
| | | | | 382/145 |
| 2010/0225905 | A1 | 9/2010 | Hayashi | |
| 2012/0023464 | A1 * | 1/2012 | Lin | G01N 21/9501 |
| | | | | 716/52 |
| 2012/0185818 | A1 * | 7/2012 | Leu | G03F 1/84 |
| | | | | 716/136 |
| 2013/0234019 | A1 * | 9/2013 | Miyamoto | G03F 9/7003 |
| | | | | 250/306 |
| 2013/0279796 | A1 * | 10/2013 | Kaizerman | G06T 7/001 |
| | | | | 382/149 |
| 2014/0169657 | A1 * | 6/2014 | Harada | H01L 22/12 |
| | | | | 382/145 |
| 2014/0301630 | A1 * | 10/2014 | Kulkarni | G06T 7/0004 |
| | | | | 382/149 |
| 2015/0110384 | A1 * | 4/2015 | Luoh | G06T 7/0006 |
| | | | | 382/149 |
| 2016/0293379 | A1 | 10/2016 | Kim et al. | |
| 2016/0300338 | A1 * | 10/2016 | Zafar | G06K 9/6201 |
| 2018/0033132 | A1 * | 2/2018 | Zafar | G06K 9/4604 |
| 2018/0276808 | A1 * | 9/2018 | Brauer | G01N 21/95607 |
| 2019/0206047 | A1 * | 7/2019 | Honda | G01N 21/9501 |

OTHER PUBLICATIONS

Shankar, Z.W. et al., "Classification of Defects on Semiconductor Wafers using Priority Rules", Defects and Diffusion Forum vols. 230-232 (2004) pp. 135-148; Trans Tech Publications, Switzerland.

* cited by examiner

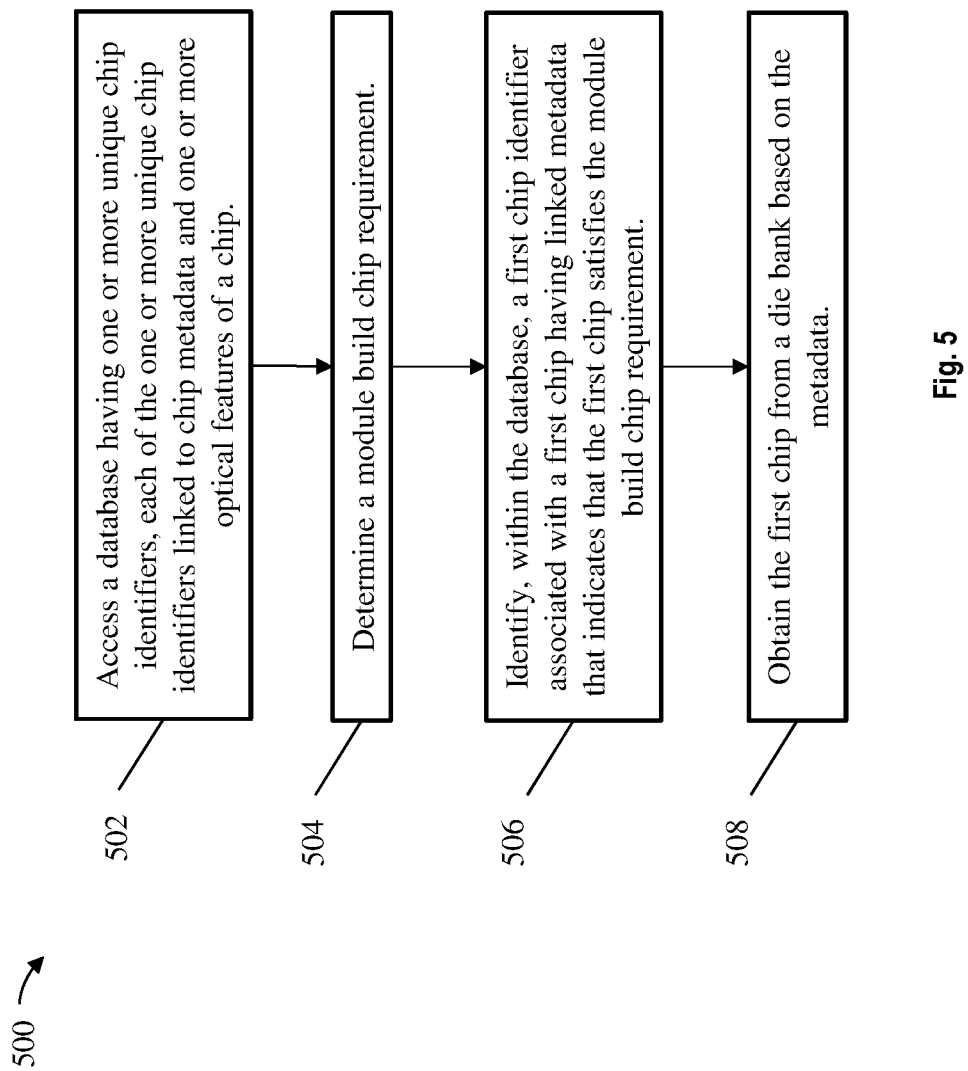

PASSIVE METHODS OF LOOSE DIE IDENTIFICATION

BACKGROUND

The present invention generally relates to integrated circuit (IC) chip location identification. More specifically, the present invention relates to passive methods of loose die identification.

During semiconductor device fabrication a large number of IC chips (commonly referred to as "dies") are concurrently formed on wafer substrates. IC chips are typically much smaller than a single wafer, and consequently, tens of thousands of chips can be fabricated using a single wafer. The actual number of IC chips from a single wafer is a function of the wafer size and the individual chip size. Wafer manufacturers typically mark bare wafers with a unique code or identifier using, e.g, laser impingement. This identification code, typically located on the wafer edge, is unique to each wafer and can be human-readable, machine-readable, or both.

The wafers are then diced into individual IC chips. Once wafers are diced, the IC chips are stored (often in die banks or die bags) so that they can be picked and assembled into chip packages. At this point, it is not easy to uniquely identify an individual die. For example, it is difficult to determine exactly where on a wafer a particular die originated. Determining the original wafer location or otherwise identifying a specific IC chip is known as chip identification. There are several reasons why it is desirable to have chip identification traceability. For example, such information is useful for process learning so that defects can be corrected, product dispositioning for known defects, qualification learning, and engineering evaluation support (e.g., wafer striping).

SUMMARY

Embodiments of the present invention are directed to a method for identifying an integrated circuit (IC) chip using optically-unique features. A non-limiting example of the method includes generating, with an imaging device, an image of the chip. One or more optical features of the chip within the image can be determined and stored in a local or remote database. Metadata associated with the chip can be generated and linked with the one or more optical features of the chip and a unique identifier of the chip in the database.

Embodiments of the present invention are directed to a method for identifying an integrated circuit (IC) chip using optically-unique features. A non-limiting example of the method includes accessing a database having one or more unique chip identifiers. Each of the one or more unique chip identifiers can be linked to chip metadata and one or more optical features of a chip. The method can include determining a module build chip requirement. The method can further include identifying, within the database, a first chip identifier of the one or more unique chip identifiers. The first chip identifier can be associated with a first chip having linked metadata that indicates that the first chip satisfies the module build chip requirement. The method can include obtaining the first chip from a die bank based on the metadata.

Embodiments of the present invention are directed to a system for identifying an integrated circuit (IC) chip using optically-unique features. A non-limiting example of the system includes an imaging device configured to take an image of a portion of the chip. The system can include a memory having computer readable instructions and a processor configured to execute the computer readable instructions. The computer readable instructions, when executed by the processor, can cause the processor to perform a method. The method can include generating, with the imaging device, the image of the chip, determining one or more optical features of the chip within the image, storing the one or more optical features of the chip, determining metadata associated with the chip, and linking the one or more optical features of the chip with the metadata and a unique identifier of the chip.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 5 depicts a flow diagram illustrating a method for optically identifying loose dies prior to module build outs according to one or more embodiments of the invention.

Figure 1:
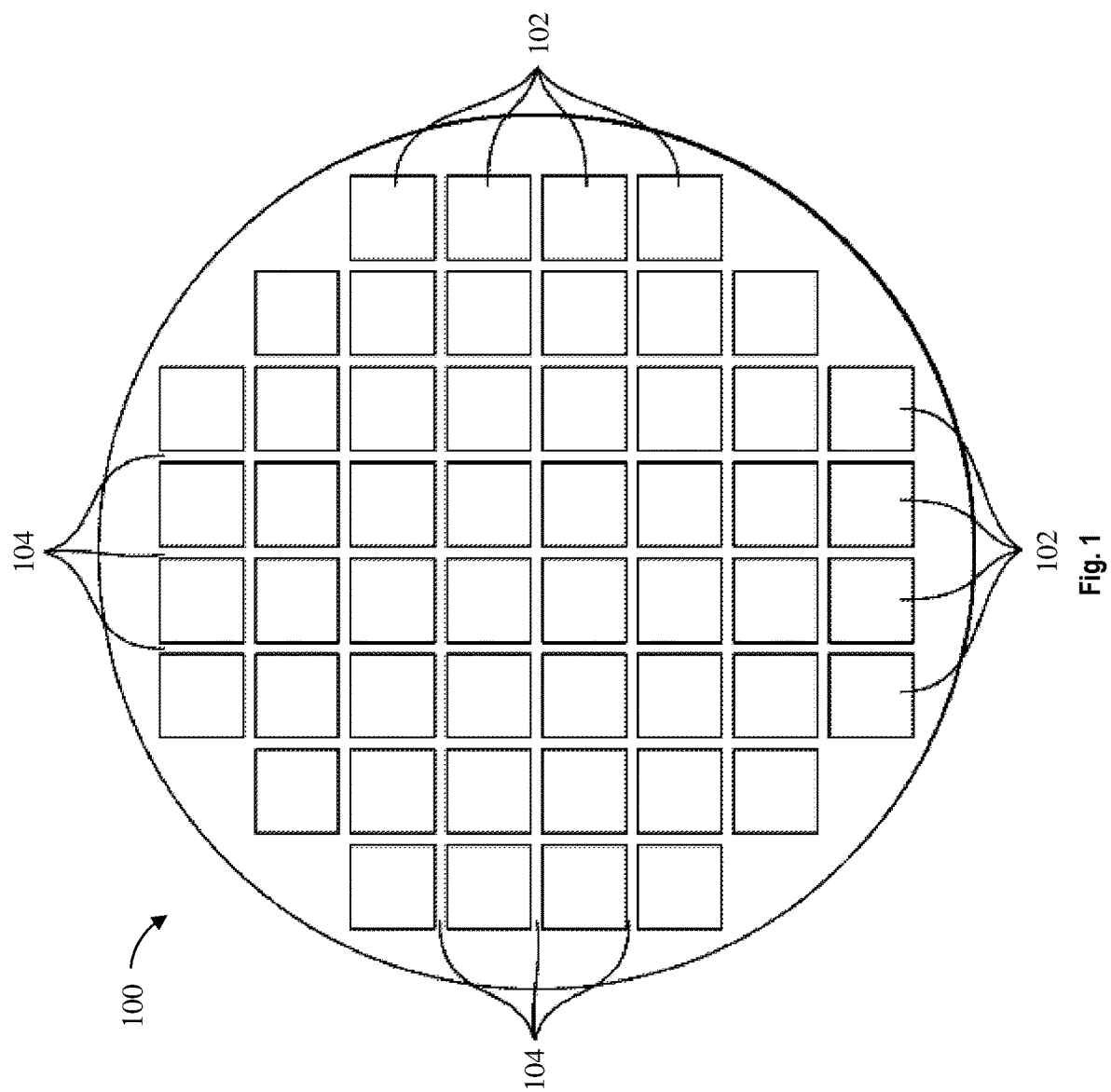
FIG. 1 depicts a top-down view of a wafer during an intermediate operation of a method of fabricating a semiconductor device according to one or more embodiments of the present invention.

The diagrams depicted herein are illustrative. There can be many variations to the diagram or the operations described therein without departing from the spirit of the invention. For instance, the actions can be performed in a differing order or actions can be added, deleted or modified.

In the accompanying figures and following detailed description of the described embodiments, the various elements illustrated in the figures are provided with two or three-digit reference numbers. With minor exceptions, the leftmost digit(s) of each reference number correspond to the figure in which its element is first illustrated.

DETAILED DESCRIPTION

For the sake of brevity, conventional techniques related to a semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the present invention, as previously noted herein, once a wafer is diced, it is not easy to uniquely identify a particular IC chip when selecting a chip for a module build. Conventional chip tracking is coarse and is often limited to a high-level separation of dies by a particular chip element. For example, a 12-core chip can be placed in a 12-core chip bag, while a 24-core chip can be placed in a 24-core chip bag. Once a 12-core chip is placed in a 12-core chip bag, however, it becomes very difficult to uniquely identify the 12-core chip from among the other 12-core chips already in the chip bag.

Solving chip identification is an industry challenge having a variety of potential solutions. One conventional approach to provide chip identification employs laser fuses. This approach, however, requires additional fuse blows to implement and a package tester for read-out. In addition, the use of laser fuses is not qualified for new, low dielectric constant technologies. Another approach involves the use of laser scribing to create a wafer-level chip identification nanoimprint. Laser scribing, however, creates mechanical damage and stress concentrations. Consequently, laser scribing is not qualified for some architectures (i.e., flip chip plastic ball grid array (FC-PBGA)) and cannot be read after packaging since typically the back side of the IC chip is covered.

Other approaches employ electronic-chip identification (i.e., e-fuse ID or ECID). Conventional ECID-based approaches, however, require additional chip design steps, a wafer test to blow fuses, a poly conductor mask (which cannot be used for CPI/packaging test sites) and require a package tester for electrical read-out. Electrical read-out of a chip's ECID post die-sort-pick (DSP) is itself challenging. For example, attempting to employ guardband specification relief for a wafer final test (WFT) that includes previously failing circuit-limited yield (CLY) chips as "good" requires that the die stock failing chips be packaged into mods to read the ECID. The ECID must then be matched to the WFT CLY data to determine if the chip can pass. There is always waste involved with this type of testing due to chip yield (i.e., each batch includes some percentage of chips that will fail).

Turning now to an overview of aspects of the present invention, one or more embodiments of the invention provide systems and methods for optically identifying loose dies prior to module build outs. High-resolution images of a die are taken, and unique die features are extracted and cataloged in a database. In some embodiments of the invention, computer vision and machine learning techniques are leveraged to uniquely identify dies through feature extraction.

In some embodiments of the invention, the database is populated with an arbitrary number of dies, their associated feature set (or die fingerprint), and die-specific metadata. In some embodiments of the invention, this database can be searched for chips meeting predetermined conditions suitable for a specific module (i.e., a targeted or special module build). For example, a chip known to be sourced from a batch satisfying a reliability or power threshold can be identified, sourced, and placed in a module known to require dies that satisfy the reliability or power threshold. In some embodiments of the invention, the database can be searched for chips having a known defect. This can be particularly useful when looking to analyze one or more chips coming from a faulty source, to identify faulty processes or fabrication systems, for debugging a problem that the faulty chip is known to manifest, or any other issue for which a known faulty chip can be leveraged.

Unique die features can include, for example, scratches on the backside or top surface of the die (crack shapes, location, coloration, etc.), variations in die edge laser grooves or dicing channels (cracks, surface patterns, roughness, etc., variations in controlled collapse chip connection (C4) bump location, size, shape, and/or any other optically-verifiable physical feature on the die surface. The combination of unique die features for a particular die can be referred to as a die fingerprint. It is not necessary for each die to be uniquely identified by the same types of die features. Instead, each die is uniquely identified based on the particular availability of unique die features on a given die. For example, a first die fingerprint for a first die can include an image of a surface scratch or metadata associated with the surface scratch, while a second die fingerprint for a second die can include both an image or metadata for a set of C4 bump locations and a unique die edge laser groove variation.

The unique features (i.e., a feature set or fingerprint) for each die can be stored in the database as an image, partial image, and/or as data that encodes the unique features. For example, the feature set can include an image of the surface of the die showing the location of a unique scratch. In addition, or alternatively, the feature set can include a subset or partial image showing only those parts of the surface of the die that contains the scratch. In addition, or alternatively, the feature set can include data that encodes the unique scratch, such as, for example, one or more pixel positions having the scratch, a shape of the scratch, a size of the scratch, and/or a width of the scratch.

The die-specific metadata can include any information regarding the specific die to which it pertains. For example, die-specific metadata for a first chip can include a wafer ID, a lot number, and specific "X" and "Y" coordinates for the original wafer location of the die on a particular wafer. The die-specific metadata can also include information such as currently known reliability, power, or test results associated with the particular wafer, lot numbers, or batch numbers of chips from which the current die was sourced. The die-specific metadata can further include die bank or die bag location information for retrieving or otherwise obtaining the die.

In some embodiments of the invention, the die-specific metadata is continuously or periodically updated as new information becomes available. For example, a series of failed test results from one or more dies sourced from a particular lot/wafer can result in a metadata update to all other chips from that same source. This metadata update can include, for example, the failed test result or any other information.

In some embodiments of the invention, candidate unique die features for a given die are compared against fingerprints already stored in the database. In some embodiments of the invention, candidate unique die features that map (or correlate within some predetermined threshold) to more than one chip in the database can be discarded. In this manner, a set of candidate unique die features for a given die can be pruned to produce a minimal set of unique features. In other words, in some embodiments of the invention, the smallest possible set of unique features required to uniquely identify the given chip from all other chips currently in the database is identified and stored in the database.

In some embodiments of the invention, two dies can include a similar unique feature (i.e., two unique features that cannot be uniquely distinguished within some defined confidence). In some embodiments of the invention, these similar unique features are supplemented with additional metadata to allow for the unique features to be distinguished. For example, two chips having an optically-similar feature (a pair of cracks that cannot be distinguished within, e.g., a confidence threshold of 90%, 95%, 98%, 99%, etc.) can be supplemented with additional metadata (e.g., an absolute or relative location of each crack on each respective chip, a color of each crack, etc.).

Turning now to a more detailed description of aspects of the present invention, FIG. 1 depicts a top-down view of a wafer 100 during an intermediate operation of a method of fabricating a semiconductor device according to one or more embodiments of the present invention. As depicted, the wafer 100 has been processed by front-end-of-line processes to fabricate a plurality of substantially identical product chips 102, also known as integrated circuit (IC) chips or dies. Each product chip 102 includes one or more integrated circuits that contain device structures. In some embodiments of the present invention, the product chips 102 are arranged in an array of rows and columns within the outer periphery of the wafer 100. It is understood, however, that the product chips 102 can be arranged in any fashion.

The number of product chips 102 can range from tens of chips to up to tens of thousands of chips on a single wafer 100. Among other factors, the actual number of product chips 102 from wafer 100 is a function of the individual chip size, as well as the wafer size. In some embodiments of the present invention, the product chips 102 are ASIC chips fabricated on the order of about 500 chips per wafer. As depicted, each of the product chips 102 has the same size (i.e., length and width). In some embodiments of the present invention, one or more of the product chips 102 has a dissimilar size. Scribe-line channels 104 are present between adjacent pairs of product chips 102 in the array. The scribe-line channels 104 are free of device structures of the integrated circuit, but can contain test devices used to evaluate post-fabrication circuit quality. While only a single wafer is depicted, typical fabrication processes yield a plurality of wafers from a single lot, each having disposed thereon a plurality of product chips. In some embodiments of the present invention, a single fabrication run generates a "lot" of about 25 wafers.

The wafer 100 can be any suitable substrate containing a semiconductor material for forming an integrated circuit. For example, the wafer 100 can be composed of a monocrystalline silicon-containing material, such as bulk or SOI single crystal silicon. In other embodiments of the present invention, the wafer 100 includes SiGe, SiC, III-V compound semiconductor, II-VI compound semiconductor, or semiconductor-on-insulator (SOI). In some embodiments of the invention, the substrate includes a buried oxide layer (not depicted). In some embodiments of the present invention, the semiconductor material constituting wafer 100 can be lightly doped with an impurity to alter its electrical properties. Specifically, the wafer 100 can be doped with an n-type impurity (e.g., phosphorus or arsenic) to render it initially n-type or can be doped with a p-type impurity (e.g., Ga, B, BF2, or Al) to render it initially p-type. The dopant concentration in the doped regions can range from $1 \times 10^{19}$ cm$^{-3}$ to $2 \times 10^{21}$ cm$^{-3}$, or between $1 \times 10^{20}$ cm$^{-3}$ and $1 \times 10^{21}$ cm$^{-3}$. Standard round wafer sizes for wafer 100 range from a diameter of about 100 mm to a diameter of 300 mm, although other wafer sizes are within the contemplated scope of the invention.

Figure 2:
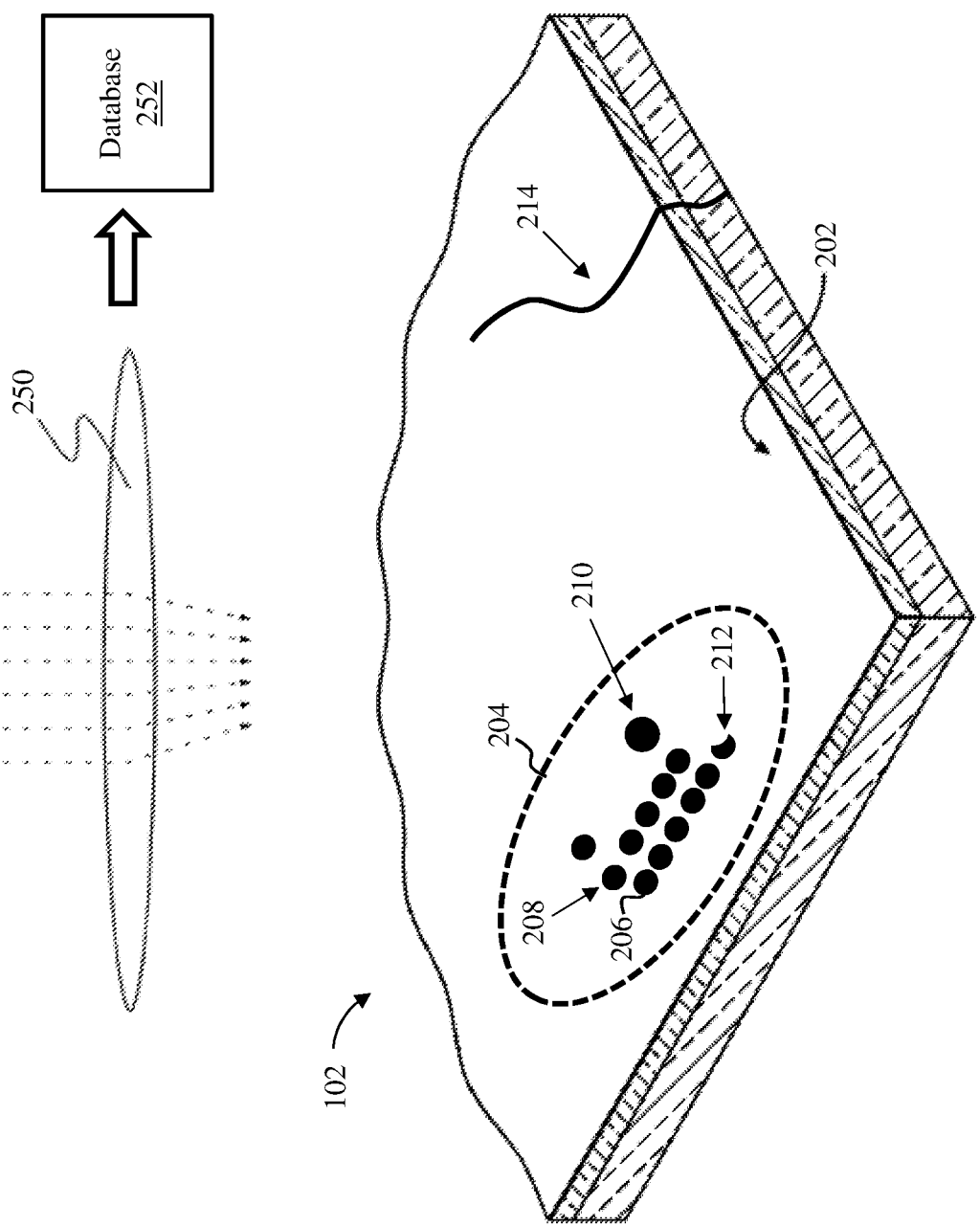
FIG. 2 depicts an isometric view of a portion of a single product chip during an intermediate operation of a method of fabricating a semiconductor device according to one or more embodiments of the invention.

FIG. 2 depicts an isometric view of a portion of a single product chip 102 during an intermediate operation of a method of fabricating a semiconductor device according to one or more embodiments of the invention. As illustrated in FIG. 2, a surface 202 of the chip 102 includes a C4 cage 204. The C4 cage 204 can include one or more C4 bumps 206 arranged in any pattern. The C4 cage 204 can be associated with a known, ideal configuration, that is, a target or expected bump orientation/layout under perfect fabrication processes. Due to process variations, however, the actual C4 cage 204 can include C4 bumps that are uniquely recognizable. For example, some of the C4 bumps can fall outside the target bump orientation/layout scheme.

As depicted in FIG. 2, the actual C4 cage 204 includes a bump 208 that is out of alignment, a bump 210 that is mis-sized (too small, or as shown, too large), and a bump 212 that is cracked. These C4 bumps, alone or in any combination, can be used as, or as part of, a unique feature set for the chip 102. While a particular set of C4 bumps is shown for ease of illustration, it is understood that the C4 bumps can include some, all, or different recognizable features. For example, any of the C4 bumps 206 in the C4 cage 204 can be characterized by their unique locations (misalignments), shapes (misshapen), surface cracks (deformed), and/or coloring. While the C4 cage 204 is depicted as located in a corner region of the chip 102, it is understood that the C4 cage 204 can be located in any region of the chip 102, and that additional C4 bumps can be located within, or external to, the C4 cage 204.

As further depicted in FIG. 2, the surface 202 of the chip 102 can also include one or more cracks 214. The cracks 214 can be characterized according to their location, shape, length, size, and/or width. While a particular crack of the cracks 214 is shown for ease of illustration, it is understood that the cracks can be arbitrarily formed. The cracks can be confined to a top surface (the surface 202) or a bottom surface of the chip 102. The cracks can run along a surface and an edge of the chip 102 (as depicted).

In some embodiments of the invention, an imaging device 250 can be positioned to take an image of the chip 102. In some embodiments of the invention, the imaging device is a high-resolution camera and the image is a high-resolution image. In some embodiments of the invention, the high-resolution camera can include a sensor having a resolution of at least 5, 10, 20, 50, 100, or more megapixels. In some embodiments of the invention, the high-resolution camera is configured to provide high-resolution images having a pixel density of at least 300, 400, 600, 1200, or more pixels per inch (PPI).

In some embodiments of the invention, the image of the chip 102 captures one or more unique features of the chip 102, such as, for example, the bump 208 that is out of alignment, the bump 210 that is mis-sized (too small, or as shown, too large), the bump 212 that is cracked, and/or the cracks 214. In some embodiments of the invention, the image(s) of the chip 102 are stored in a local or remote database 252.

In some embodiments of the invention, the imaging device 250 includes or is communicatively coupled to a communication module (not depicted). The communication module can include computer-executable instructions, code, or the like that, responsive to execution by one or more processor(s), can perform functions including, but not limited to, communicating image data with the local or remote database 252, for example, via wired or wireless communication networks. In some embodiments of the invention, the imaging device 250 includes or is communicatively coupled to a computer or control console (not depicted). The computer or control console can include a display and can be configured to receive one or more inputs from a user. In some embodiments of the invention, the inputs include instructions for the imaging device 250, for example, to obtain image data including one or more images of the chip 102 and transmitting the obtained image data to a local or remote database.

Figure 3:
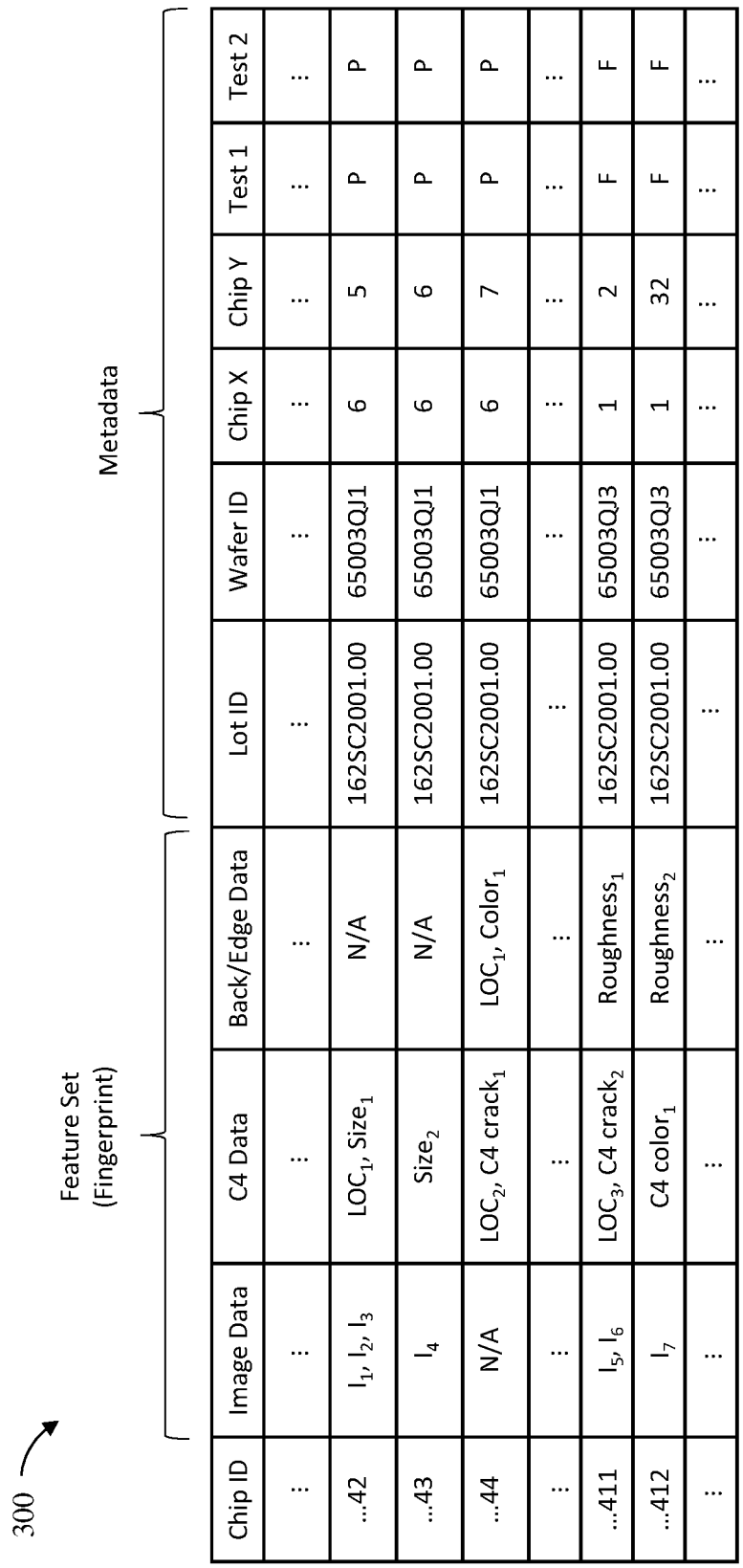
FIG. 3 depicts a partial view of a data structure having stored chip identification data according to one or more embodiments of the invention.

FIG. 3 depicts a partial view of a data structure 300 having stored chip identification data according to one or more embodiments of the invention. As described previously herein, imaging device 250 can take one or more images of the chip 102. In some embodiments of the invention, computer vision and/or machine learning techniques are used to extract one or more unique features (i.e., a feature set or fingerprint) of the chip 102, based on the one or more images. In some embodiments of the invention, one or more users manually extract one or more unique features of the chip 102 based on the one or more images. In some embodiments of the invention, these unique features are stored, for example, in the data structure 300 maintained in the local or remote database 252 (depicted in FIG. 2). While the data structure 300 is illustrated as a table, it is understood that the data structure 300 can alternatively be structured as any lookup table, array, or as any other type of data structure.

In some embodiments of the invention, the chip identification data includes a unique chip ID for each chip having data in the data structure 300. For example, as depicted in FIG. 3 the Chip ID for one of the chips in the data structure 300 is "X42," where "X" is any alphanumeric string of arbitrary length sufficient to uniquely identify the chip.

In some embodiments of the invention, the chip identification data includes one or more fields describing a feature set or fingerprint for each chip having data in the data structure 300. For example, as depicted in FIG. 3 the data structure 300 includes an "Image Data" field, a "C4 Data" field, and a "Back/Edge Data" field. These fields are merely exemplary, and other feature set fields are possible according to one or more embodiments. In some embodiments of the invention, these fields are populated for a particular chip after imaging the chip for unique features according to one or more embodiments.

As depicted in FIG. 3, the "Image Data" field includes one or more images (or no images at all) for one or more chips represented in the data structures 300. In some embodiments of the invention, these data entries are full image files. In some embodiments of the invention, these data entries are partial images or compressed images of a portion of an original image. The partial image or compressed image can include a portion of a chip (or chip surface, edge, etc.) depicting one or more unique features of the chip. In some embodiments of the invention, these data entries do not include the actual images, but instead, include compressed metadata obtained from the images. For example, an image of a crack on a chip surface can be used to determine a length of the crack, and this length can be stored in the Image Data.

As depicted in FIG. 3, the "C4 Data" field includes one or more entries associated with one or more C4 bump characteristics of a chip. For example, "$LOC_1$" can encode a location of one or more bumps, "$Size_1$" can encode a size of one or more bumps, "C4 $crack_1$" can encode a crack on one or more bumps, and "C4 $color_1$" can encode a color of one or more bumps. These data elements are merely exemplary, and other C4 Data types are possible and within the contemplated scope of the invention.

As depicted in FIG. 3, the "Back/Edge Data" field includes one or more entries associated with a die backside, top surface, kerf, edge, etc. of a chip. For example, "$LOC_1$" can encode a location of a laser grove on an edge of the chip, "$Color_1$" can encode a color of a crack or groove on the backside, and "$Roughness_1$" can encode an edge roughness of a die. These data elements are merely exemplary, and other Back/Edge Data types are possible and within the contemplated scope of the invention.

In some embodiments of the invention, each die feature set (fingerprint) is linked or otherwise associated with a unique chip ID. For example, as depicted in FIG. 3 the chip defined as "X42" is linked with a feature set having various images (Image Data $I_1$, $I_2$, and $I_3$) as well as unique C4 bump locations and sizes (C4 Data $LOC_1$, $Size_1$).

In some embodiments of the invention, the chip identification data includes one or more fields describing metadata for each chip having data in the data structure 300. As illustrated in the data structure 300, the metadata can include a unique lot identifier, wafer identifier, chip X identifier, and chip Y identifier to provide the precise location on a specific wafer of a specific lot where each chip in the data structure 300 originated. It is understood that more or less information can be stored in the data structure 300, depending on the requirements of a given application. For example, lot and/or wafer identification do not need to be stored in the data structure 300 for applications having only a single lot or single wafer. In some embodiments of the present invention, the data structure 300 includes additional identifiers, such as, for example, time of fabrication identifiers, fabrication line identifiers, and employee identifiers. In this manner, any information associated with the chips can be stored in the data structure 300 for easy recall.

As discussed previously herein, the metadata can also include one or more tests results, such as reliability or power test results (e.g., the "Test 1" field and the "Test 2" field). These test results can be test results of the actual chip, or test results of other chips which share a same source as the current chip (e.g., a same Lot ID, Wafer ID, and/or wafer coordinates that are close to the current chip within some predetermined threshold distance). These test fields are merely exemplary, and other test fields are possible according to one or more embodiments.

In some embodiments of the invention, the metadata is linked or otherwise associated with a unique chip ID. For example, as depicted in FIG. 3 a first chip defined as "X42" is linked with a first Lot ID ("162SC2001.00"), a first Wafer ID ("65003QJ1"), a first Chip X coordinate ("6"), a first Chip Y coordinate ("5"), a first Test 1 result ("P" for pass), and a first Test 2 result ("P" for pass). A second chip defined as "X411" is linked with a second Lot ID ("162SC2001.00," which in this case is the same lot as the first chip), a first Wafer ID ("65003QJ3"), a first Chip X coordinate ("1"), a first Chip Y coordinate ("2"), a first Test 1 result ("F" for fail), and a first Test 2 result ("F" for fail).

The metadata within the data structure 300 can be searched to obtain the unique chip ID of a die (or dies) satisfying any desired metadata requirement, such as, for example, a particular electrical measurement or test data result. In some embodiments of the invention, the data structure 300 is leveraged to determine specific chips for a module build for targeted builds/tests or for filtering failing or marginal chips out of a particular application/module.

In some embodiments of the invention, the data structure 300 could be searched for chips that are associated with a "pass" of Test 1, Test 2, both Test 1 and Test 2, or any other desired chip feature (e.g., chips from a particular lot, wafer, or wafer coordinates, chips having some particular feature set, etc.). A search for chips associated with a "pass" for Test 1 or Test 2 could return, for example, Chip IDs "X42," "X43," and "X44." In this manner, the data structure 300 can be leveraged to determine one or more chips that are known to have some desirable feature or trait that is required for a particular module.

In some embodiments of the invention, the data structure 300 could be searched for chips that are associated with a "fail" of Test 1, Test 2, both Test 1 and Test 2, or any other desired chip feature. A search for chips associated with a "fail" for Test 1 or Test 2 could return, for example, Chip IDs "X411" and "X412." Such a search could be useful in any application where locating chips known to express a particular failure is desirable, such as when looking for faulty chips for testing purposes.

Figure 4:
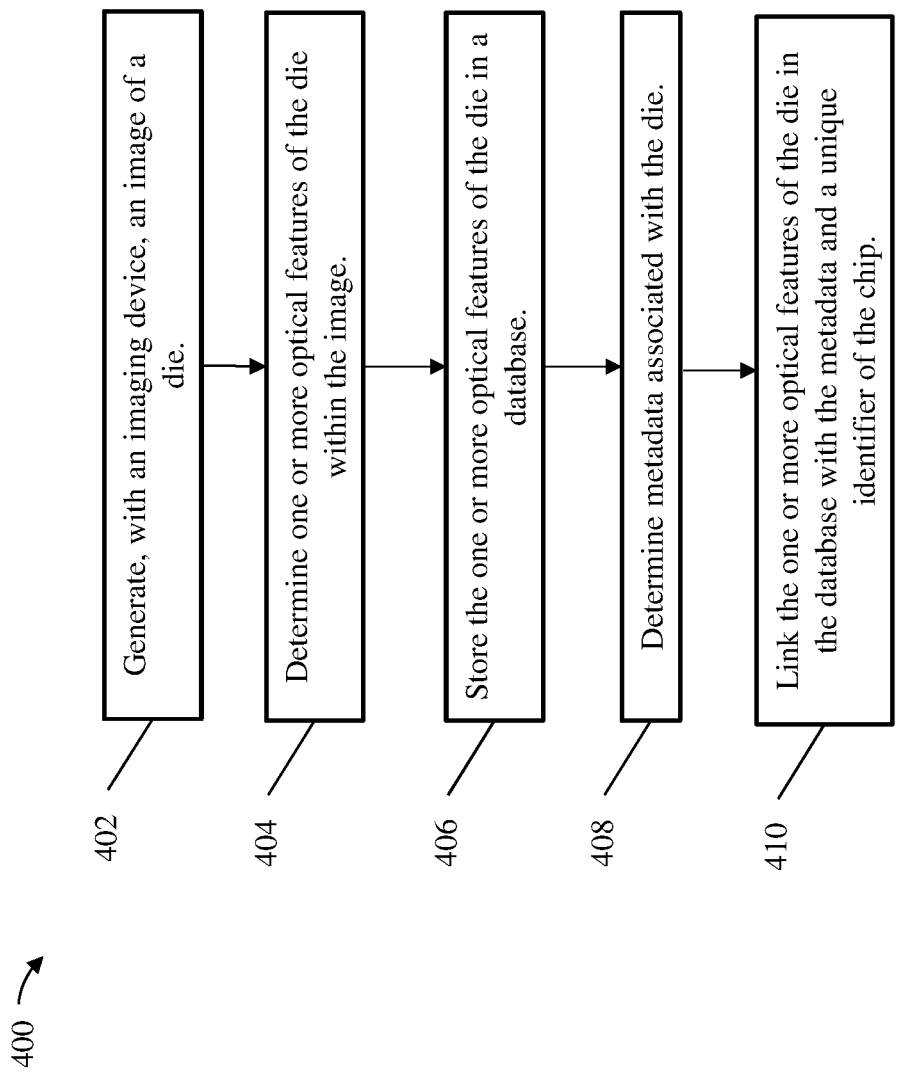
FIG. 4 depicts a flow diagram illustrating a method for optically identifying loose dies prior to module build outs according to one or more embodiments of the invention.

FIG. 4 depicts a flow diagram 400 illustrating a method for optically identifying loose dies prior to module build outs according to one or more embodiments of the invention. As shown at block 402, an image of a die is generated. In some embodiments of the invention, the imaging device is a camera and the image includes a high-resolution image of a portion of the chip. In some embodiments of the invention, the image includes a top surface, a backside, or an edge of the chip.

At block 404, one or more optical features of the chip are determined within the image. The one or more optical features can include, for example, a scrape or scratch shape, size, location, or color, a laser groove or dicing channel shape or dimension, a C4 bump location, shape, size, or color, or a surface roughness on a backside of the chip, a top surface of the chip, or an edge of the chip.

At block 406, the one or more optical features of the chip are stored. In some embodiments of the invention, the optical features are stored in a local or remote database. In some embodiments of the invention, storing the one or more optical features of the chip includes generating a candidate unique optical feature and in response to determining that a database does not include a previously stored optical feature that matches the candidate unique optical feature, storing the candidate unique optical feature in the database.

At block 408, metadata associated with the chip is determined. In some embodiments of the invention, the metadata includes a lot identification, a wafer identification, and wafer coordinates of the chip prior to dicing. In some embodiments of the invention, the metadata includes a test result of a second chip having a same lot identification or wafer identification as the chip.

At block 410, the one or more optical features of the chip are linked with the metadata and a unique identifier of the chip. The optical features of the chip can be linked to the metadata and the unique identifier according to one or more embodiments, such as described with respect to the data structure 300.

FIG. 5 depicts a flow diagram 500 illustrating a method for optically identifying loose dies prior to module build outs according to one or more embodiments of the invention. As shown at block 502, a database having one or more unique chip identifiers can be accessed. Each of the one or more unique chip identifiers can be linked to chip metadata and one or more optical features of a chip according to one or more embodiments.

At block 504, a module build chip requirement is received or determined. In some embodiments of the invention, the module build chip requirement includes a reliability test result or a power test result. In some embodiments of the invention, the reliability test result or the power test result indicates a passing score or grade. In some embodiments of the invention, the reliability test result or the power test result indicates a failing score or grade.

At block 506, a first chip identifier of the one or more unique chip identifiers is identified within the database. The first chip identifier can be associated with a first chip having linked metadata that indicates that the first chip satisfies the module build chip requirement.

At block 508, the first chip is obtained from a die bank based on the metadata. The first chip can be obtained by accessing the metadata. In some embodiments of the invention, the metadata can include a die bag or die bank location where the first chip is currently stored.

In some embodiments of the invention, the method further includes generating, with an imaging device, an image of the first chip. The method can further include determining a first optical feature of the first chip within the image and storing the first optical feature of the first chip in the database.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describe having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, are used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (e.g., rotated 90 degrees or at other orientations), and the spatially relative descriptors used herein should be interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

As previously noted herein, for the sake of brevity, conventional techniques related to a semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilizes a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method for identifying an integrated circuit (IC) chip, the method comprising:

generating, with an imaging device, an image of the chip;

determining one or more optical features of the chip within the image;

generating a candidate unique optical feature comprising one of the one or more optical features;

in response to determining that a database does not include a previously stored optical feature that matches the candidate unique optical feature, storing the candidate unique optical feature in the database;

determining metadata associated with the chip; and linking the candidate unique optical feature of the chip with the metadata and a unique identifier of the chip.

2. The method of claim 1, wherein the imaging device is a camera and the image comprises a high-resolution image of a portion of the chip.

3. The method of claim 1, wherein the image comprises a top surface, a backside, or an edge of the chip.

4. The method of claim 1, wherein the one or more optical features comprise a scrape or scratch shape, size, location, or color, a laser groove or dicing channel shape or dimension, a C4 bump location, shape, size, or color, or a surface roughness on a backside of the chip, a top surface of the chip, or an edge of the chip.

5. The method of claim 1, wherein the metadata comprises a lot identification, a wafer identification, and wafer coordinates of the chip prior to dicing.

6. The method of claim 5, wherein the metadata further comprises a test result of a second chip having a same lot identification or wafer identification as the chip.

7. A system for identifying an integrated circuit (IC) chip, the system comprising:

an imaging device configured to take an image of a portion of the chip;

a memory having computer readable instructions; and a processor configured to execute the computer readable instructions, the computer readable instructions, when executed by the processor, cause the processor to perform a method comprising:

generating, with the imaging device, the image of the chip;

determining one or more optical features of the chip within the image;

generating a candidate unique optical feature comprising one of the one or more optical features;

in response to determining that a database does not include a previously stored optical feature that matches the candidate unique optical feature, storing the candidate unique optical feature in the database;

determining metadata associated with the chip; and linking the candidate unique optical feature of the chip with the metadata and a unique identifier of the chip.

8. The system of claim 7, wherein the imaging device is a camera and the image comprises a high-resolution image of the chip.

9. The system of claim 7, wherein the image comprises a top surface, a backside, or an edge of the chip.

10. The system of claim 7, wherein the one or more optical features comprise a scrape or scratch shape, size, location, or color, a laser groove or dicing channel shape or dimension, a C4 bump location, shape, size, or color, or a surface roughness on a backside of the chip, a top surface of the chip, or an edge of the chip.

11. The system of claim 7, wherein the metadata comprises a lot identification, a wafer identification, and wafer coordinates of the chip prior to dicing.

* * * * *